United States Patent [19]

Shou et al.

[11] Patent Number: 5,650,752
[45] Date of Patent: Jul. 22, 1997

[54] AMPLIFIER CIRCUIT WITH PARALLEL CONNECTED AMPLIFIERS

[75] Inventors: Guoliang Shou; Makoto Yamamoto; Sunao Takatori, all of Tokyo, Japan

[73] Assignees: Yozan Inc., Tokyo; Sharp Corporation, Osaka, both of Japan

[21] Appl. No.: 458,179

[22] Filed: Jun. 2, 1995

[30] Foreign Application Priority Data

Jun. 3, 1994 [JP] Japan ................................ 6-145488

[51] Int. Cl.⁶ ................................................ H03F 3/68
[52] U.S. Cl. .......................... 330/84; 330/107; 330/264; 330/294; 330/295
[58] Field of Search ................... 330/84, 107, 124 R, 330/264, 294, 295, 306

[56] References Cited

U.S. PATENT DOCUMENTS 4,656,429  4/1987  Masuda et al. ................. 330/107 X
5,084,683  1/1992  Nicoluni ........................... 330/107

*Primary Examiner*—James B. Mullins
*Attorney, Agent, or Firm*—Cushman, Darby & Cushman IP Group of Pillsbury Madison & Sutro LLP

[57] ABSTRACT

An amplifier circuit has a wide frequency range which is broader than the frequency range expected from its circuit parameters. The amplifier circuit comprises a plurality of unit amplifier circuits connected in parallel. Each unit amplifier circuit contains an odd number of inverters serially connected from the first stage to the last stage, an input capacitance connected to the input terminal of the first stage, and a feedback capacitance connecting the output terminal of the inverter of the last stage to the input terminal of the inverter of the first stage. Thus, the amplifier circuit operates in a wide frequency range with little decrease in gain at high frequencies.

7 Claims, 3 Drawing Sheets

AMPLIFIER CIRCUIT WITH PARALLEL CONNECTED AMPLIFIERS

FIELD OF THE INVENTION

The present invention relates to an amplifier circuit for amplifying an analog voltage in LSI, particularly to an amplifier circuit with a plurality of inverters and a feedback capacitance connecting an output and an input of the amplifier.

BACKGROUND OF THE INVENTION

An amplifier circuit with a plurality of inverters and a feedback capacitances is proposed by the inverters of the present invention, for compensating linearity in the input/output relationship of the amplifier of analog calculation circuits in LSI.

SUMMARY OF THE INVENTION

There is a problem in the amplifier circuit that the gain steeply decreases over a predetermined frequency which is determined by various parameters of the LSI circuit. However, a broader range of frequency is required in many applications.

Therefore, the present invention has an object to provide an amplifier circuit with wide frequency range, broader than the frequency expected from the circuit parameters.

According to the present invention, a plurality of unit amplifier circuits are parallelly connected. By changing frequency characteristics of the unit amplifier circuits from one another, a combination characteristics of total unit amplifier circuits is obtained.

"Ampi" is an unit amplifier circuit, "INVi" is an input capacitance, "C11" and "C21" are input capacitances, "Cf1" and "Cf2" are feedback capacitances and "CL1" and "CL2" are lowpass capacitances.

PREFERRED EMBODIMENT OF THE PRESENT INVENTION

Figure 1:
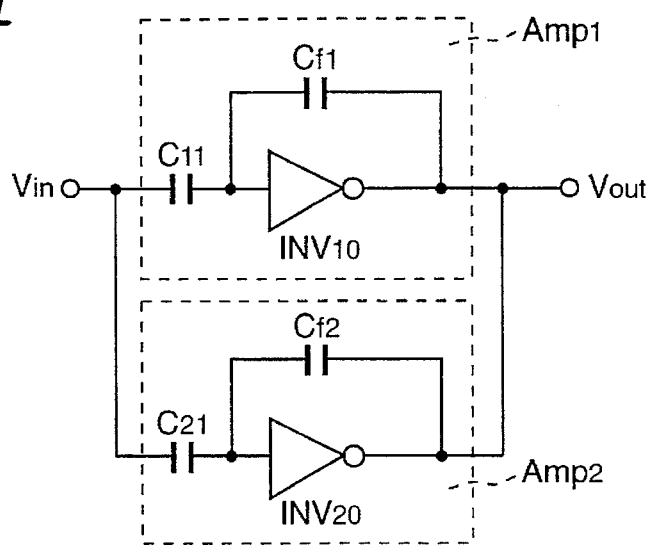
FIG. 1 a circuit diagram of an amplifier circuit relating to the first embodiment of the present invention.

Hereinafter, an embodiment of the present invention is described with reference to the attached drawings. FIG. 1 is a circuit diagram showing an amplifier circuit of the first embodiment of the present invention.

An amplifier circuit in FIG. 1 is composed of two parallelly connected unit amplifier circuits Amp1 and Amp2 commonly connected to input voltage Vin and output voltage Vout. The first unit amplifier Amp1 consists of inverter INV10, input capacitance C11 connected to the input terminal of inverter INV10 and feedback capacitance Cf1 for feeding an output of inverter INV10 back to the input. The second unit amplifier circuit Amp2, similarly constructed to Amp1, is composed of inverter INV20, input capacitance C21 and feedback capacitance Cf2.

Input capacitances C11 and C21 prevent direct current flow therethrough due to the input voltage, when the input voltage is impressed. The feedback capacitances Cf1 and Cf2 have a function to generate accurately the output voltage accurately proportional to the input voltage.

Figure 2:
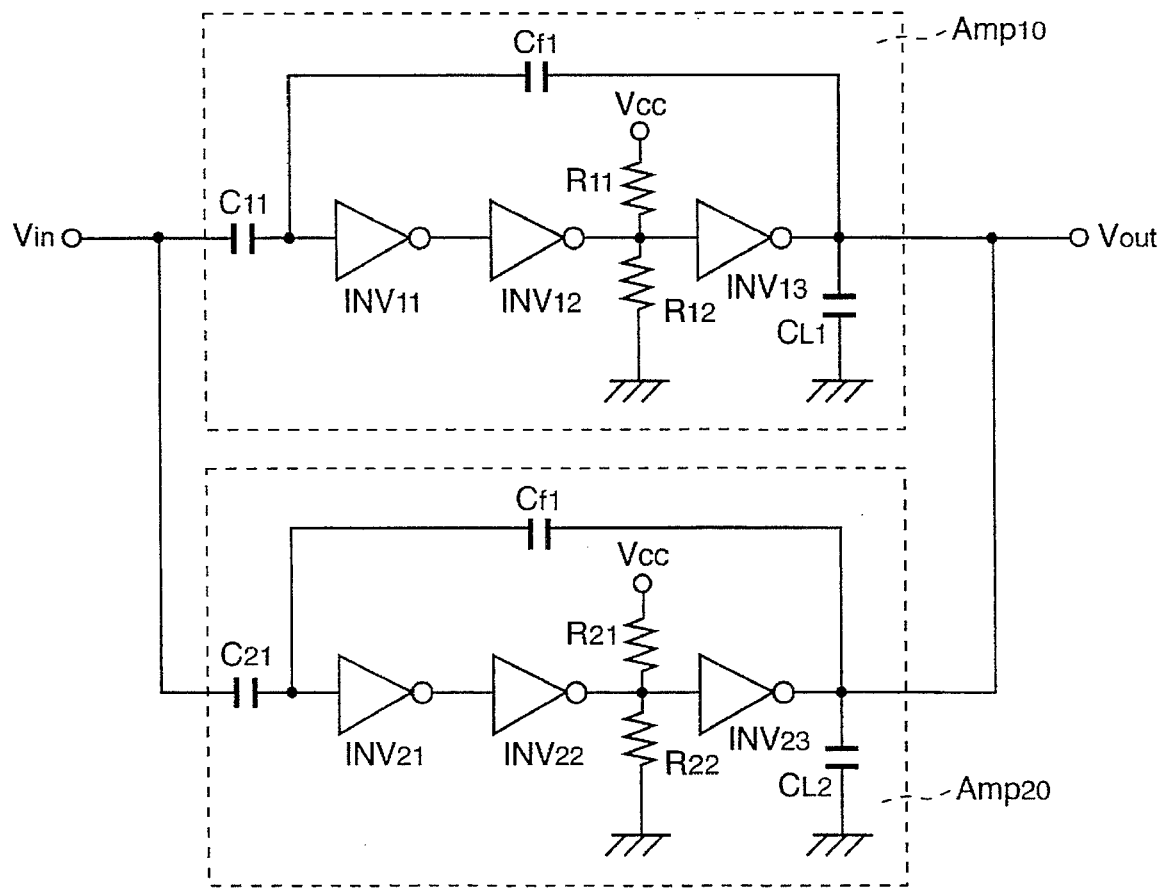
FIG. 2 is a circuit diagram of an amplifier circuit relating to the second embodiment of the present invention.
Figure 3:
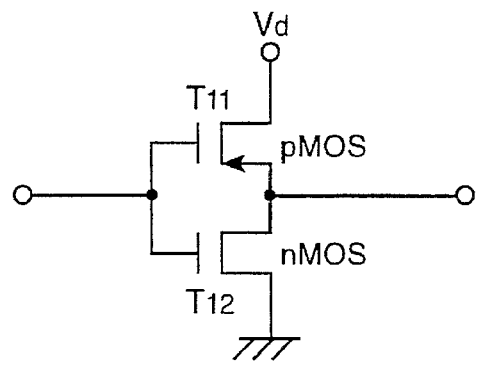
FIG. 3 is a circuit diagram of an inverter shown in FIGS. 1 and 2.

FIG. 2 is a circuit diagram showing the second embodiment of the present invention, consisting of two unit amplifier circuits parallelly connected with three inverters serially connected.

The first unit amplifier circuit Amp10 consists of serially connected inverters INV11, INV12 and INV13. The input capacitance C11 is connected to an input terminal of the inverter INV11 of the first stage for receiving the input voltage while preventing direct current flow therethrough. Feedback capacitance Cf1 feeds an output of inverter INV13 of the last stage back to an input of inverter INV11 of the first stage for making the input voltage coincide with the output voltage constrainedly. A lowpass capacitance CL1 is connected at one terminal to the output of the inverter INV13 of the last stage, and is connected at the other terminal ground.

An output of the second inverter INV12 between the first and the final stages is connected with a pair of equilibrium resistances R11 and R12. The first resistance R11 is connected at one terminal to INV12 and at the other terminal to a voltage source Vcc. The second resistance R12 is connected at one terminal to INV12 and at the other terminal to the ground. The equilibrium resistance decreases the gain of the amplifier circuit so as to prevent unstable oscillation or divergence.

The amplifier circuits in FIG. 1 has rather narrow range of linearity in input/output relationship because this circuit has low gain due to the existence of only one inverter. The practical frequency range in operation is narrow. While, in the second embodiment, three stage serial inverters are used so that the gain is increased. This enlarges the range of the linear performance range.

The lowpass capacitances CL1 contributes to the phase margin and the equilibrium resistances contributes to the gain margin so that trustable oscillation and divergence are prevented up in the high frequency area. Inverters formed in a LSI are so small in size that only a little delay time occurs. The unstable oscillation easily occurs in low frequency. The lowpass capacitance decreases gain of the amplifier in high frequency so as to prevent oscillation.

The first resistance R11 balances current through two MOSs in the inverter INV12 so that the lead of the MOSs becomes smaller. The second resistance R12 decreases the open gain of the inventor INV12 so that the gain of the amplifier circuit is lowered in the total frequency range.

In order to prevent unstable oscillation and divergence, at least one of the lowpass capacitances CL1 or equilibrium resistances R11 and R12 should be applied. However, when only CL1 is used, its capacitive value becomes large. When only the equilibrium resistances are used, the linearity is deteriorated. Therefore, both of them are to be applied.

The second unit amplifier circuit Amp20 consists of inverters INV21, INV22, INV23, similar to the first. Input capacitance C21 is connected in the input side of inverter INV21 in the first stage for preventing electric current. Feedback capacitance Cf2 feeds an output of inverter INV23 in the last stage back to an input of inverter INV21 in the first stage for the linearity. Equilibrium resistances R21, R22 and lowpass capacitance CL2 are connected to the output of the second inverter and the last inverter for preventing the unstable oscillation or divergence.

Each inverter in the unit amplifier circuit of the FIGS. 1 and 2 is a C-MOS inverter composed of two serially connected MOS transistors. One is a pMOS type transistor T11 and the other is a nMOS type transistor T12. A drain ofpMOS type transistor T11 is connected to a bias voltage Vd and its source is connected with a drain of nMOS type transistor T12. Gates of both transistors are connected to each other and then connected commonly to the input capacitance. A source of nMOS type transistor T12 is grounded.

In the embodiments above, the number of parallelly connected unit amplifier circuits is two, however, the present invention is not limited and there is no limitation in stages if stages are over two.

From the technical viewpoint of electrical performance, the performance is improved by increasing a number of unit amplifiers, and from the economical viewpoint of manufacturing cost, it is better to have fewer unit amplifiers. In the practical products, the number of unit amplifiers is decided in view of these points and the balance between them.

Figure 4:
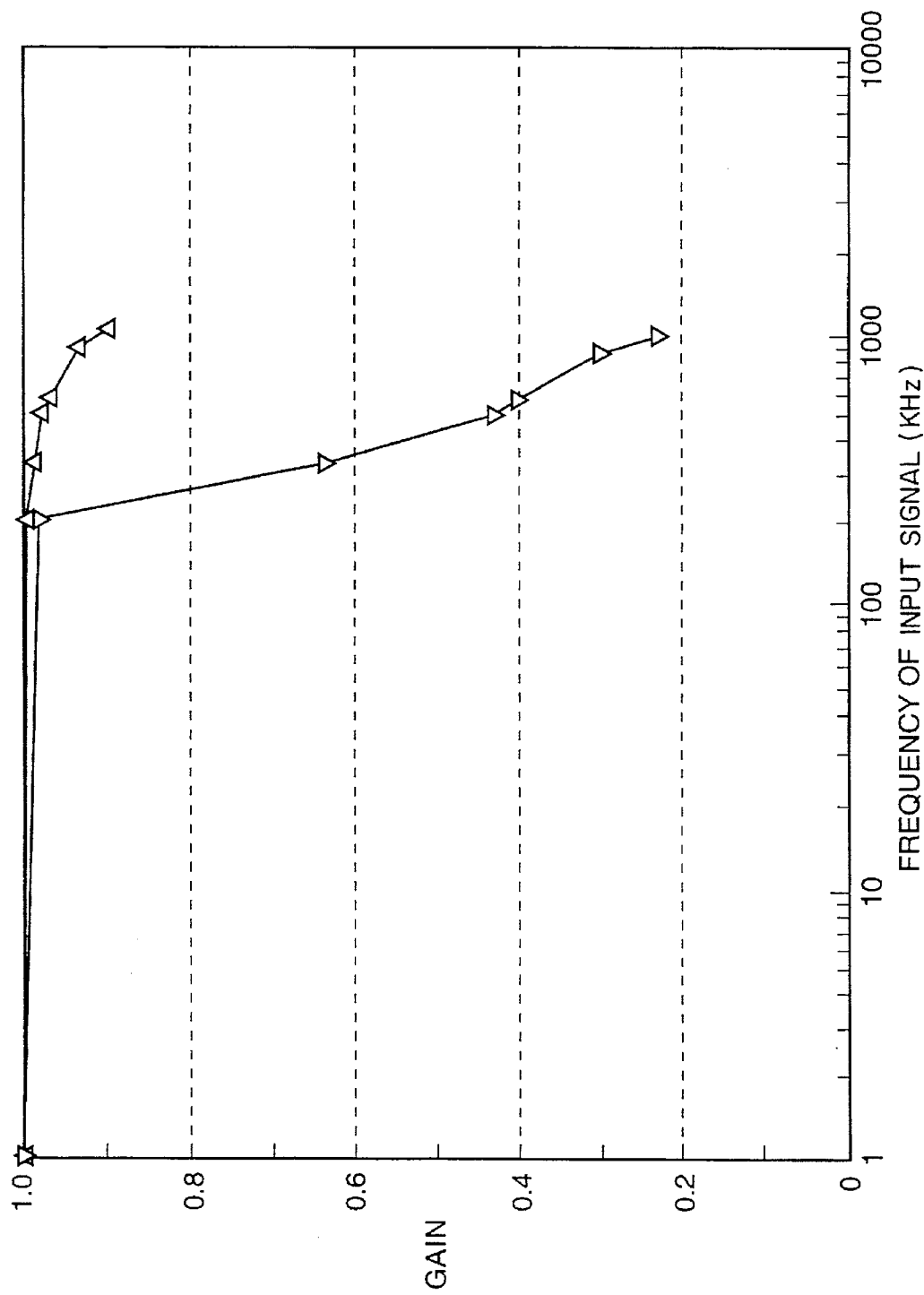
FIG. 4 is a graph showing a relation between input signal frequency and gains of an amplifier circuit and an unit amplifier circuit.

Next, Table 1 and FIG. 4 show a comparison of characteristics of gain vs frequency in the circuits of four parallel unit amplifiers and a single unit amplifier. FIG. 4 shows gains in the vertical axis and a frequency of input signal in the horizontal axis. In the FIG. △—△is a characteristic of parallelly connected amplifiers and ▽—▽is a characteristic of a single unit amplifier circuit. The horizontal axis is shown by logarithmic scale.

TABLE 1

| Input Frequency | 200 KHz | 333 KHz | 500 KHz | 570 KHz | 850 KHz | 1000 KHz |
|---|---|---|---|---|---|---|
| Unit Amplifier Circuit | 1.0 | 0.6 | 0.4 | 0.4 | 0.3 | 0.2 |
| Amplifier Circuit | 1.0 | 1.0 | 1.0 | 1.0 | 0.9 | 0.9 |

When the frequency of an input signal is close to 1000 KHz, the decrease in gains is remarkable in single unit amplifier circuit. On the other hand, in parallelly amplifiers, there is little decrease in gains in the range up to 1000 KHz.

From the comparison above, it will be understood that the circuit of a plurality of unit amplifiers has more driving ability than the single unit amplifier. It is possible to increase number of fan-out The parallel connection is advantageous in output accuracy due to an averaging effect of a plurality of circuits.

Figure 5:
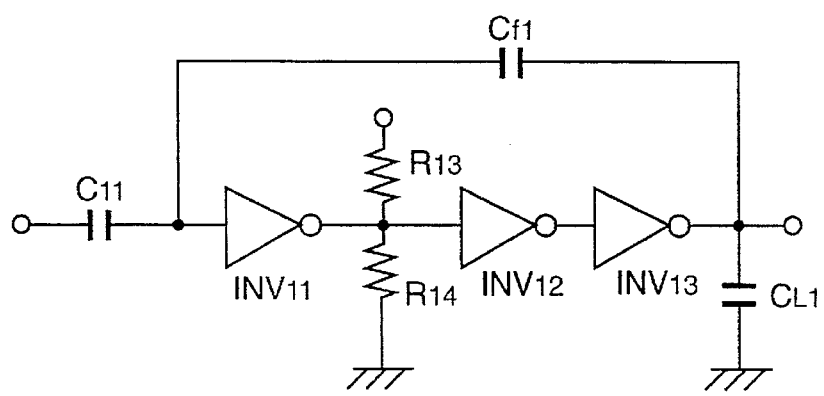
FIG. 5 is a circuit diagram showing a deformed shape of an unit amplifier circuit of the embodiment.
Figure 6:
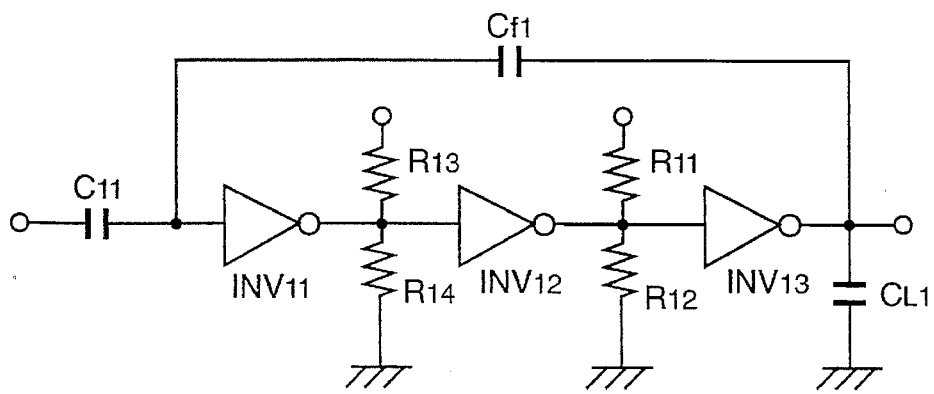
FIG. 6 is a circuit diagram showing mother deformed shape of an unit amplifier circuit of the embodiment.

FIGS. 5 and 6 show variations of the unit amplifier circuit Amp10 in of FIG. 2. In FIG. 5, equilibrium resistances R13 and R14 are arranged between the first and the second inverters, INV11 and INV12. In FIG. 6, there are resistances R13 and R14 between INV11 and INV12 and resistances R11 and R12 between the third inverter and fourth inverter, INV12 and INV13. FIG. 5 and FIG. 6 can protect both circuits form unstable oscillation.

To the second unit amplifier circuit Amp20 of FIG. 2, the above variations of FIGS. 5 and 6 can be applied. These circuits are freely combined for Amp10 and Amp20.

As mentioned above, according to the present invention, a plurality ofparallelly connected unit amplifier circuits have totally good frequency characteristics and increases number of fan-out by improving an ability of supplying electric current and improves a calculation accuracy.

What is claimed is:

1. An amplifier circuit comprising a plurality of unit amplifier circuits connected in parallel, each of said unit amplifiers having:

an odd number of inverters serially connected from a first stage to a last stage, each inverter having input and output terminals;

an input capacitance connected to said input terminal of said inverter of said first stage; and a feedback capacitance connecting said output terminal of said inverter of said last stage to said input terminal of said inverter of said first stage.

2. An amplifier circuit as claimed in claim 1, wherein number of said unit amplifiers is two.

3. An amplifier circuit as claimed in claim 1, wherein said odd number is one.

4. An amplifier circuit as claimed in claim 1, wherein said odd number is more than two.

5. An amplifier circuit as claimed in claim 4, wherein said odd number is three.

6. An amplifier circuit as claimed in claim 4, wherein each of said unit amplifiers further comprises:

a low pass capacitance for passing low frequency signals, said low pass capacitance having opposite terminals, wherein one of said terminals is connected to said output of said inverter of said last stage and the other of said terminals is connected to ground;

a first resistance having opposite terminals, wherein one of said terminals is connected to said output of said inverter of a stage between said first and last stage and and the other of said terminals is connected to a voltage source; and a second resistance having opposite terminals, wherein one of said terminals is connected to said output of said inverter and the other of said terminals is connected to ground.

7. An amplifier circuit as claimed in claim 1, wherein each of said inverters is a complementary metal-oxide silicon (CMOS) inverter comprising:

a pMOS transistor connected at a drain to a voltage source, at a gate to an input and at a source to an output; and a nMOS transistor connected at a source to the source of said pMOS transistor, at a drain to ground and at a gate to said input connected with said pMOS transistor.

\* \* \* \* \*